(12) United States Patent
Buckley et al.

(10) Patent No.: US 6,359,373 B1
(45) Date of Patent: Mar. 19, 2002

(54) ACTUATOR HOUSING

(75) Inventors: Paul Buckley, Rainham; Michael Peter Cooke, Gillingham, both of (GB)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/639,571

(22) Filed: Aug. 14, 2000

(30) Foreign Application Priority Data

Aug. 20, 1999 (GB) .............................................. 9919661

(51) Int. Cl.$^7$ .............................................. H01L 41/08
(52) U.S. Cl. ...................................................... 310/328
(58) Field of Search ........................................ 310/328

(56) References Cited

U.S. PATENT DOCUMENTS

| 4,958,101 A | * | 9/1990 | Takahashi | 310/328 |
| 5,208,506 A | * | 5/1993 | Yamashita | 310/328 |
| 6,198,206 B1 | * | 3/2001 | Saarmaa | 310/340 |

* cited by examiner

Primary Examiner—Thomas M. Dougherty
(74) Attorney, Agent, or Firm—Thomas A. Twomey

(57) ABSTRACT

An actuator housing for a piezoelectric actuator arrangement including a piezoelectric stack, the housing comprising a first housing portion for connecting leads which are electrically connected to the piezoelectric stack and a second housing portion for the piezoelectric stack. The first and second housing portions are integrally moulded and are formed from a material which permits flexing of the first housing portion and the connecting leads.

7 Claims, 2 Drawing Sheets

ACTUATOR HOUSING

TECHNICAL FIELD

The invention relates to a housing for a piezoelectric actuator arrangement.

BACKGROUND OF THE INVENTION

Piezoelectric actuators are commonly used in fuel injectors to control movement of a valve needle within a fuel injector nozzle body, movement of the valve needle being used to control the delivery of fuel into an engine cylinder or other combustion space. The distance through which the valve needle is moved is controlled by controlling the energization level, and hence the axial length, of a piezoelectric stack. The energization level of the piezoelectric stack is controlled by applying a voltage across the stack by means of an electrical connector which is connected to a voltage supply, and connecting leads which connect the piezoelectric stack to the electrical connector.

Conventionally, the piezoelectric stack is mounted directly in the fuel injector housing. During assembly of the fuel injector, external loading of the injector body can result in vibration of the piezoelectric stack which can damage the connecting leads. Furthermore, during use of the fuel injector, wear of the end caps of the piezoelectric stack and thermal expansion effects can cause axial movement of the piezoelectric stack within the injector body which can cause the connecting leads to vibrate and fray. In order to alleviate these problems, it is known to connect the connecting leads to sliding contacts which are arranged on the piezoelectric stack. However, the sliding contacts are prone to oxidisation which can degrade performance. It is further desirable to isolate the piezoelectric stack and its associated connecting leads from fuel or other liquids.

SUMMARY OF THE INVENTION

It is an object of the present invention to provide a housing for a piezoelectric stack which enables the aforementioned problems of the prior art to be alleviated.

According to the present invention, there is provided a housing for a piezoelectric actuator arrangement including a piezoelectric stack, the housing comprising a first housing portion for connecting leads which are electrically connected to the piezoelectric stack and a second housing portion for the piezoelectric stack, the first and second housing portions being integrally moulded and being formed from material which permits flexing of the first housing portion and the connecting leads.

The invention provides the advantage that, during assembly of a valve or fuel injector containing the actuator arrangement, a degree of flexing of the connecting leads is permitted which prevents damage being caused to the connecting leads when the housing, including the piezoelectric actuator arrangement, is clamped or secured in position. In addition, during use of the valve or fuel injector, vibration and axial movement of the piezoelectric stack due to thermal expansion effects and wear of the piezoelectric stack end caps does not lead to damage of the connecting leads as the connecting leads are able to flex to absorb any such vibrations or movements.

Conveniently, the housing may be formed from a polymer material.

Preferably, the housing includes a third housing portion housing an electrical connector, the third housing portion being integrally moulded with the first and second housing portions, the electrical connector being provided with electrical terminals for connection with the connecting leads. By integrally forming the third housing portion for the electrical connector with the first and second housing portions, the need for additional sealing of the electrical terminals is removed.

The second housing portion may be a sleeve member.

The actuator housing may include the piezoelectric stack.

BRIEF DESCRIPTION OF THE DRAWINGS

The invention will now be described, by way of example only, with reference to the following figures in which.

DESCRIPTION OF THE PREFERRED EMBODIMENT

Figure 1:
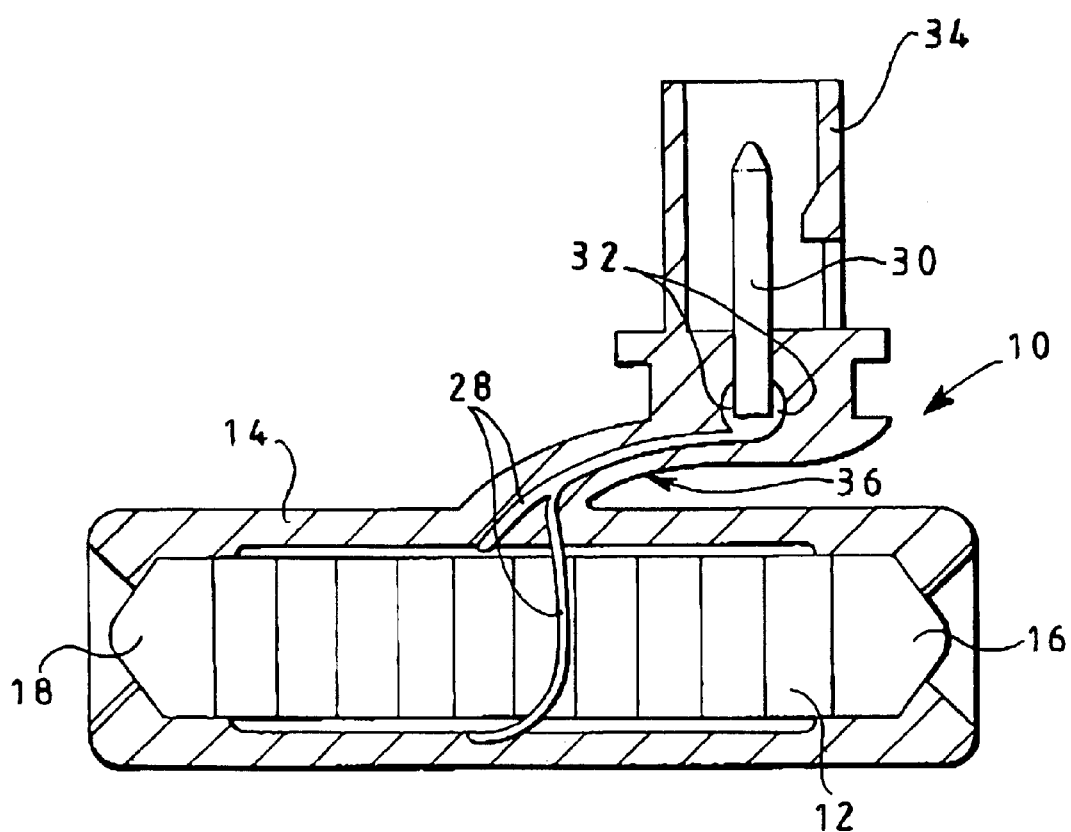
FIG. 1 is a schematic view of an actuator housing for a piezoelectric actuator in accordance with an embodiment of the present invention.
Figure 2:
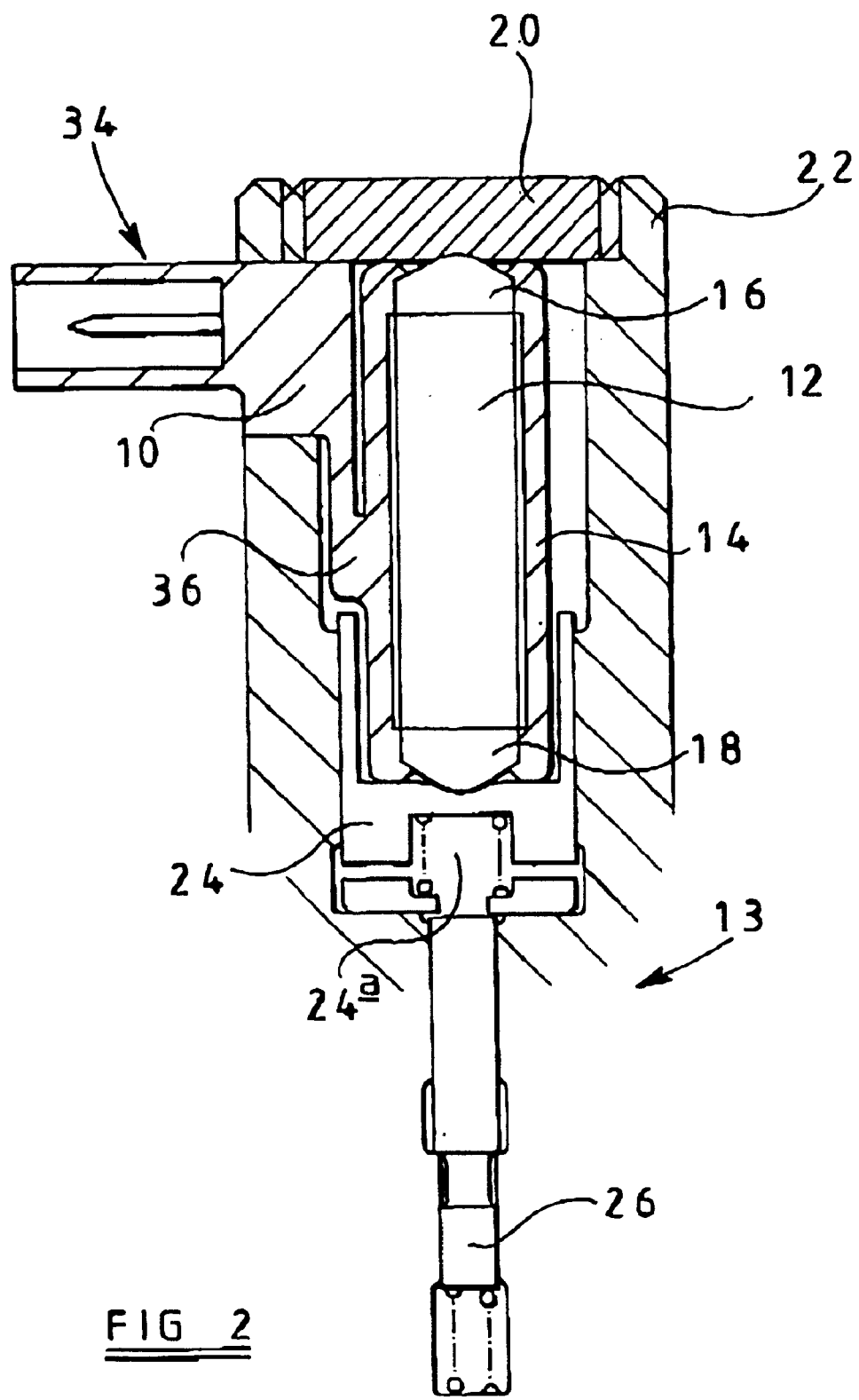
FIG. 2 is a schematic view of a fuel injector including a piezoelectric actuator arranged within the actuator housing shown in FIG. 1.

Referring to FIGS. 1 and 2, there is shown an actuator housing, referred to generally as 10, for a piezoelectric actuator arrangement including a piezoelectric stack 12, for use in controlling the operation of a valve of a fuel injector, referred to generally as 13. The housing 10 includes a sleeve portion 14 within which the piezoelectric stack 12 is located, the piezoelectric stack 12 engaging first and second end members 16, 18 respectively, each end member 16,18 having an end surface projecting through the open ends of the sleeve portion 14. Preferably, the end members 16, 18 of the piezoelectric stack 12 are made of steel and have an exposed surface of part-spherical form. The first end member 16 abuts an abutment member 20 which is rigidly fixed to the fuel injector body 22. The second end member 18 is engageable with a piston member 24 such that, in use, an increase in the axial length of the piezoelectric stack causes the end member 18 to impart movement to the piston member 24, the piston member 24 controlling the fluid pressure within a control chamber 24a which, in turn, controls movement of a spill valve member 26 to control fuel delivery from the fuel injector.

As illustrated, the end members 16, 18 are of domed, or similar, form such that, during assembly, the stack 12 can adopt a position which need not be exactly parallel to the axis of the injector, thereby compensating for manufacturing tolerances.

In use, energization of the piezoelectric stack 12, and hence the axial length of the stack, is controlled by applying a voltage across the stack 12. The piezoelectric stack 12 is provided with connecting leads 28, one end of each lead 28 being connected to the stack 12 and the other end of each lead 28 being connected to an electrical connector 30 at electrical terminals 32. The connector 30 and the terminals 32 are housed within a connector housing portion 34 which is integrally formed with a flexible neck portion 36 of the housing 10 and with the sleeve portion 14. The connecting leads 28 are arranged within the neck portion 36 such that, during assembly and use of the fuel injector 13, a degree of flexing of the connecting leads 28 is permitted.

The housing 10 therefore forms a three-part housing for the piezoelectric stack 12, the connecting leads 28, and the electrical connector 30 comprising the sleeve portion 14, the flexible neck portion 36 and the connector housing portion 34.

The housing 10 may be formed from a polymer material using conventional injection moulding techniques, conveniently using a single shot technique. During manufacture of the housing 10, the end cap members 16, 18 may be supported in the injection moulding die such that they remain free from polymer material which may otherwise reduce axial stiffness of the piezoelectric stack 12. Typically, the material from which the housing 10 is formed may be a polymer having mechanical properties similar to those of Nylon at room temperature, but with better thermal and chemical resistances. For example, a liquid crystal polymer material may be used.

As the electrical connector housing portion 34 and the sleeve portion 14 are flexibly attached by the flexible neck portion 36, the connecting portion 34 housing the electrical connector can be clamped robustly into the fuel injector body 22 without causing damage to the connecting leads 28 or the piezoelectric stack 12 during assembly of the fuel injector 13, for example resulting from the stack lying not exactly parallel to the axis of the injector. In addition, any displacement of the piezoelectric stack 12 during its service life due to wear of the surfaces of the end cap members 16, 18, or due to thermal expansion effects, does not result in damage being caused to the connecting leads 28 or the electrical terminals 32 as the connecting leads 28 and the neck portion 36 are able to flex. The actuator housing 10 also provides the advantage that the electrical terminals 32 are sealed within the connector housing part 34 during moulding of the housing 10. Thus, additional seals at the electrical terminals need not be provided.

The sleeve portion 14 conveniently forms a substantially fluid tight seal with the end cap members 16, 18, thus isolating the stack 12 and the associated leads and electrical connections from fuel or other fluids.

It will be appreciated that the connector housing portion 34 need not form part of the housing 10 for the actuator, the connecting leads 28, moulded within the flexible neck portion 36, projecting from the housing 10 for connection with electrical terminals of an external electrical connector.

It is envisaged that the flexible neck portion 36 may join the sleeve portion 14 close to the end of the sleeve portion 14 housing the end member 16, the position of which is fixed, in use, thereby reducing the degree by which the neck portion 36 must flex in use.

Although the description hereinbefore is of the use of the invention in a spill valve for a fuel injector, it will be appreciated that the invention is suitable for use in other applications, for example as an injection timing control valve.

What is claimed is:

1. A piezoelectric actuator arrangement comprising:
    a piezoelectric stack having a first end member and a second end member; and
    a polymeric housing comprising,
        a first housing portion for connecting leads electrically connected to the piezoelectric stack, and
        a second housing portion containing the piezoelectric stack,
    wherein at least one of the first and the second end members project outside is second housing portion, the first and second housing portions integrally molded and formed from a polymer material which permits flexing of the first housing portion and the connecting leads.

2. The piezoelectric actuator arrangement as claimed in claim 1, wherein the first and said second end members are domed-shaped.

3. The piezoelectric actuator arrangement as claimed in claim 1, wherein the housing further comprises a polymeric third housing portion housing an electrical connector, the third housing portion being integrally molded with the first and second housing portions, the electrical connector being provided with electrical terminals for connection with the connecting leads.

4. The piezoelectric actuator arrangement as claimed in claim 1, wherein the second housing portion is a sleeve member.

5. The piezoelectric actuator arrangement as claimed in claim 1, wherein the first housing portion takes the form of a flexible neck portion.

6. A fuel injector comprising a piezoelectric actuator arrangement as claimed in claim 1.

7. A piezoelectric actuator arrangement comprising:
    a piezoelectric stack having at least one of a first domed-shaped end member and a second domed-shaped end member; and
    an integrally molded polymeric actuator housing having at least three integrally molded housing portions including,
        a polymeric sleeve housing portion having at least two open end regions for holding the piezoelectric stack, wherein at least one of the first and second domed-shaped end members of the piezoelectric stack project through the open end regions;
        a polymeric connector housing portion for holding and electrically insulating an electrical connector provided with electrical terminals connected to connecting leads, and
        a flexible polymeric neck housing portion integrally molded to the sleeve housing portion and to the connector housing portion, flexibly and mechanically connecting the sleeve portion to the connector housing portion, wherein the neck portion houses and electrically insulates the connecting leads electrically connected to the piezoelectric stack.

* * * * *